US 9,425,652 B2

United States Patent
Rippon et al.

(10) Patent No.: US 9,425,652 B2
(45) Date of Patent: Aug. 23, 2016

(54) ADAPTIVE HOLDOVER TIMING ERROR ESTIMATION AND CORRECTION

(71) Applicant: Schweitzer Engineering Laboratories, Inc., Pullman, WA (US)

(72) Inventors: Daniel B. Rippon, Pullman, WA (US); Shankar V. Achanta, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 211 days.

(21) Appl. No.: 14/305,608

(22) Filed: Jun. 16, 2014

(65) Prior Publication Data
US 2015/0364953 A1    Dec. 17, 2015

(51) Int. Cl.
H03L 1/02    (2006.01)
H02J 13/00   (2006.01)

(52) U.S. Cl.
CPC .............. *H02J 13/0013* (2013.01); *H03L 1/02* (2013.01)

(58) Field of Classification Search
CPC ...... H02J 13/0013; H03L 1/02; H03L 1/022; H03L 7/099; H04W 56/00; H04W 56/0005; H04W 56/001; H04W 56/0015; H04W 56/0025; H04W 56/0035; H04W 56/005; G01S 19/03; G01S 19/25; G01S 19/256
See application file for complete search history.

(56) References Cited

U.S. PATENT DOCUMENTS

| | | |
|---|---|---|
| 5,160,926 A | 11/1992 | Schweitzer, III |
| 5,557,284 A | 9/1996 | Hartman |
| 5,737,715 A | 4/1998 | Deaton |
| 6,144,334 A | 11/2000 | Claffey |
| 6,229,479 B1 | 5/2001 | Kozlov |
| 6,483,856 B1 | 11/2002 | Bird |
| 7,146,516 B2 | 12/2006 | Dhupar |

(Continued)

FOREIGN PATENT DOCUMENTS

| | | |
|---|---|---|
| WO | 9747987 | 12/1997 |
| WO | 2012151006 | 11/2012 |
| WO | 2014005016 | 1/2014 |

OTHER PUBLICATIONS

Zhou et al., Adaptive Correction Method for an OCXO and Investigation of Analytical Cumulative Time Error Upper Bound, Jan. 2011, IEEE Transactions on Ultrasonics, Ferroelectrics, and Frequency Control, vol. 58, No. 1, pp. 43-50.*

PCT/US2013/064942 Patent Cooperation Treaty, International Search Report and Written Opinion of the International Searching Authority, Jan. 29, 2014.

Tippenhauer, N.O., Popper, C., Rasmussen, K.B., Capkun, S., On the Requirements for Successful GPS Spoofing Attacks, In Proceedings of the ACM Conference on Computer and Communications Security (CCS), Oct. 2011.

Moore, P., Crossley, P., GPS Applications in Power Systems Part 1 Introduction to GPS, Tutorial: GPS in Power Systems, Power Engineering Journal, Feb. 1999.

Jafarnia-Jahromi, A., Broumandan, A., Nielsen, J., Lachapelle, G., "GPS Vulnerability to Spoofing Threats and a Review of Antispoofing Techniques", International Journal of Navigation and Observation vol. 2012, Article ID 127072, Feb. 2012.

(Continued)

*Primary Examiner* — Toan Le
(74) *Attorney, Agent, or Firm* — Jared L. Cherry; Richard M. Edge

(57) ABSTRACT

Disclosed herein are a variety of various systems and method for adaptive holdover time error estimation. In one embodiment a system may include a local time source configured to generate a local time signal and an external time source interface configured to receive an external time signal. A time source subsystem may be configured to compare the local time signal and the external time signal and to determine a temperature-dependent signal drift rate of the local time signal relative to the external time signal. The time source subsystem may be a time-dependent signal drift rate of the local time signal relative to the external time signal. A holdover subsystem may detect a loss of reception of the external time signal during a holdover period and may estimate a total maximum error based on an estimated maximum time-dependent error and an estimated maximum temperature-dependent error.

25 Claims, 6 Drawing Sheets

(56) References Cited

U.S. PATENT DOCUMENTS

| | | | |
|---|---|---|---|
| 7,375,683 B2 | 5/2008 | Smith | |
| 7,398,411 B2 | 7/2008 | Zweigle | |
| 7,436,232 B2 | 10/2008 | Sivero | |
| 7,440,427 B1 | 10/2008 | Katz | |
| 7,606,541 B1 * | 10/2009 | Nicholls | H04J 3/0644 455/146 |
| 7,940,213 B2 | 5/2011 | Harper | |
| 7,952,519 B1 | 5/2011 | Nielsen | |
| 7,978,130 B1 | 7/2011 | Cohen | |
| 7,979,228 B2 | 7/2011 | Zurbuchen | |
| 8,055,288 B2 | 11/2011 | Ladd | |
| 8,138,972 B2 | 3/2012 | Underbrink | |
| 8,159,391 B2 | 4/2012 | Papadimitratos | |
| 8,237,609 B2 | 8/2012 | Talbot | |
| 8,325,087 B2 | 12/2012 | Thomson | |
| 8,326,319 B2 | 12/2012 | Davis | |
| 8,446,896 B2 | 5/2013 | Bedrosian | |
| 8,564,330 B1 | 10/2013 | Radulov | |
| 8,655,608 B2 | 2/2014 | Guzman-Casillas | |
| 8,867,520 B2 * | 10/2014 | Nicholls | H04J 3/0688 370/350 |
| 9,083,503 B2 | 7/2015 | Sagen | |
| 9,270,442 B2 | 2/2016 | Rice | |
| 9,319,100 B2 | 4/2016 | Achanta | |
| 2002/0136172 A1 | 9/2002 | Chun | |
| 2002/0158693 A1 | 10/2002 | Soong | |
| 2002/0167934 A1 | 11/2002 | Carter | |
| 2003/0087654 A1 | 5/2003 | Wheeler | |
| 2003/0107513 A1 | 6/2003 | Abraham | |
| 2004/0062279 A1 | 4/2004 | Primrose | |
| 2004/0166879 A1 | 8/2004 | Meadows | |
| 2004/0228368 A1 | 11/2004 | Jecmen | |
| 2006/0259806 A1 | 11/2006 | Zweigle | |
| 2007/0132773 A1 | 6/2007 | Plante | |
| 2007/0194987 A1 | 8/2007 | Fedora | |
| 2008/0062039 A1 | 3/2008 | Cohen | |
| 2008/0169978 A1 | 7/2008 | Powell | |
| 2008/0186229 A1 | 8/2008 | Van Diggelen | |
| 2008/0198069 A1 | 8/2008 | Gronemeyer | |
| 2009/0117928 A1 | 5/2009 | Ladd | |
| 2009/0160705 A1 | 6/2009 | Matsuzaki | |
| 2009/0315764 A1 | 12/2009 | Cohen | |
| 2010/0030916 A1 | 2/2010 | Greenwood | |
| 2010/0034190 A1 | 2/2010 | Yun | |
| 2010/0073228 A1 | 3/2010 | Smith | |
| 2010/0117899 A1 | 5/2010 | Papadimitratos | |
| 2010/0127928 A1 | 5/2010 | Thomson | |
| 2010/0190509 A1 | 7/2010 | Davis | |
| 2010/0222068 A1 | 9/2010 | Gaal | |
| 2010/0231445 A1 | 9/2010 | Tarlow | |
| 2010/0231448 A1 | 9/2010 | Harper | |
| 2010/0253578 A1 | 10/2010 | Mantovani | |
| 2010/0254225 A1 | 10/2010 | Schweitzer, III | |
| 2011/0001668 A1 | 1/2011 | Cobb | |
| 2011/0035066 A1 | 2/2011 | Schweitzer | |
| 2011/0068973 A1 | 3/2011 | Humphreys | |
| 2011/0085540 A1 | 4/2011 | Kuwabara | |
| 2011/0102258 A1 | 5/2011 | Underbrink | |
| 2011/0102259 A1 | 5/2011 | Ledvina | |
| 2011/0169577 A1 | 7/2011 | Nicholls | |
| 2011/0181466 A1 | 7/2011 | Serrano | |
| 2011/0227787 A1 | 9/2011 | Gum | |
| 2011/0261917 A1 | 10/2011 | Bedrosian | |
| 2011/0285586 A1 | 11/2011 | Ferguson | |
| 2011/0287779 A1 | 11/2011 | Harper | |
| 2012/0005326 A1 | 1/2012 | Bradetich | |
| 2012/0026037 A1 | 2/2012 | Thomson | |
| 2012/0030495 A1 | 2/2012 | Chandhoke | |
| 2012/0066418 A1 | 3/2012 | Foster | |
| 2012/0116677 A1 | 5/2012 | Higgison | |
| 2012/0179404 A1 | 7/2012 | Lee | |
| 2012/0182181 A1 | 7/2012 | Dai | |
| 2012/0195253 A1 | 8/2012 | Irvine | |
| 2012/0195350 A1 | 8/2012 | Das | |
| 2012/0323397 A1 | 12/2012 | Schweitzer, III | |
| 2013/0157593 A1 | 6/2013 | Achanta | |
| 2013/0244624 A1 | 9/2013 | Das | |
| 2013/0328606 A1 | 12/2013 | Ravi | |
| 2013/0335266 A1 | 12/2013 | Vollath | |
| 2014/0003199 A1 | 1/2014 | Dougan | |
| 2014/0094218 A1 | 4/2014 | Hammes | |
| 2014/0100702 A1 | 4/2014 | Schweitzer | |
| 2014/0111249 A1 | 4/2014 | Whitehead | |
| 2014/0111377 A1 | 4/2014 | Achanta | |
| 2014/0114608 A1 | 4/2014 | Achanta | |
| 2014/0232595 A1 | 8/2014 | Rife | |
| 2014/0247185 A1 | 9/2014 | Achanta | |
| 2014/0250972 A1 | 9/2014 | Achanta et al. | |
| 2014/0327574 A1 | 11/2014 | Achanta | |
| 2014/0334477 A1 | 11/2014 | Stahlin | |
| 2015/0043697 A1 | 2/2015 | Achanta | |
| 2015/0312023 A1 | 10/2015 | Rice | |

OTHER PUBLICATIONS

Wullems, C., "A Spoofing Detection Method for Civilian L1 GPS and the E1-B Galileo Safety of Life Service". IEEE Transactions on Aerospace and Electronic Systems, Aug. 2011.

Wen, H., Huang, P. Y., Dyer, J., Archinal, A., Fagan, J., "Countermeasures for GPS Signal Spoofing," Proceedings of the 18th International Technical Meeting of the Satellite Division of the Institute of Navigation (ION GNSS 2005), Long Beach, CA, Sep. 2005, pp. 1285-1290.

Gurtner, W., Estey, L., "Rinex: The Receiver Independent Exchange Format Version 3.00", Nov. 28, 2007.

Gurtner, W., "Rinex: The Receiver Independent Exchange Format Version 2", Sep. 2008.

PCT/US2013/064012, Patent Cooperation Treaty, International Search Report and Written Opinion of the International Searching Authority, Dec. 19, 2013.

PCT/US2013/058297, Patent Cooperation Treaty, International Search Report and Written Opinion of the International Searching Authority, Feb. 14, 2014.

PCT/US2013/065695, Patent Cooperation Treaty, International Search Report and Written Opinion of the International Searching Authority, Mar. 10, 2014.

PCT/US2013/065447, Patent Cooperation Treaty, International Search Report and Written Opinion of the International Searching Authority, Mar. 13, 2014.

PCT/US2014/010507 Patent Cooperation Treaty, International Search Report and Written Opinion of the International Searching Authority, May 6, 2014.

PCT/US2015/054144 Patent Cooperation Treaty, International Search Report and Written Opinion of the International Searching Authority, Jan. 4, 2016.

Shepard, D., Humphreys, T., Fansler, A., "Evaluation of the Vulnerability of Phasor Measurement Units to GPS Spoofing Attacks", Oct. 2, 2011.

PCT/US2014/010422 Patent Cooperation Treaty, International Search Report and Written Opinion of the International Searching Authority, Sep. 16, 2014.

PCT/US2014/034358 Patent Cooperation Treaty, International Search Report and Written Opinion of the International Searching Authority, Sep. 22, 2014.

PCT/US2014/049813 Patent Cooperation Treaty, International Search Report and Written Opinion of the International Searching Authority, Apr. 2, 2015.

PCT/US2015/024000 Patent Cooperation Treaty, International Search Report and Written Opinion of the International Searching Authority, Jul. 13, 2015.

PCT/US2015/029939 Patent Cooperation Treaty, International Search Report and Written Opinion of the International Searching Authority, Aug. 12, 2015.

* cited by examiner

ADAPTIVE HOLDOVER TIMING ERROR ESTIMATION AND CORRECTION

RELATED APPLICATIONS

None

TECHNICAL FIELD

This disclosure relates to distribution of time information between networked devices. Particularly, this disclosure relates to accurate time distribution in an electric power transmission or distribution system.

BRIEF DESCRIPTION OF THE DRAWINGS

Non-limiting and non-exhaustive embodiments of the disclosure are described, including various embodiments of the disclosure with reference to the figures, in which.

Figure 1:
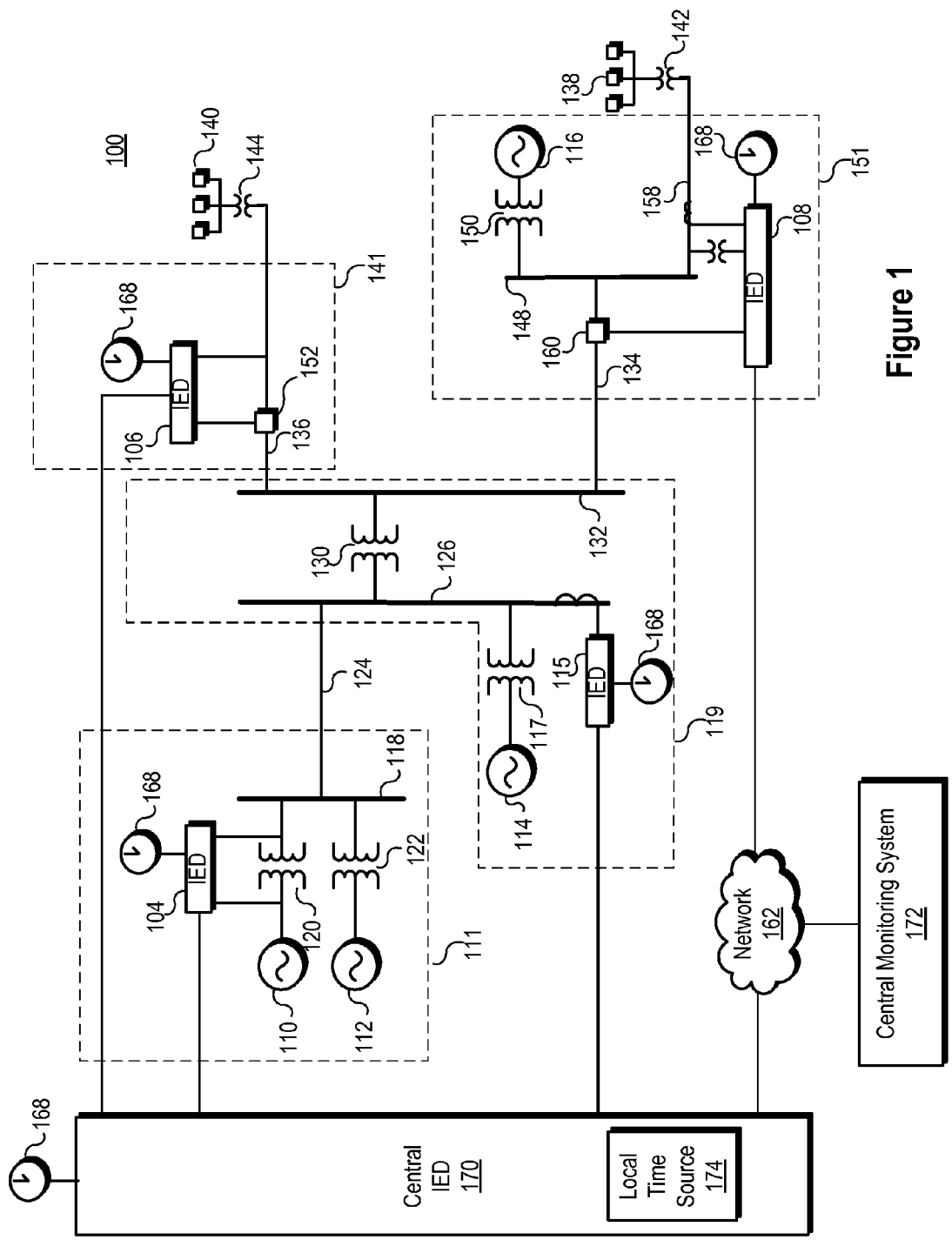
FIG. 1 illustrates an example of an embodiment of a simplified one-line diagram of an electric power delivery system with various substations consistent with embodiments of the present disclosure.

In the following description, numerous specific details are provided for a thorough understanding of the various embodiments disclosed herein. However, those skilled in the art will recognize that the systems and methods disclosed herein can be practiced without one or more of the specific details, or with other methods, components, materials, etc. In addition, in some cases, well-known structures, materials, or operations may not be shown or described in detail in order to avoid obscuring aspects of the disclosure. Furthermore, the described features, structures, or characteristics may be combined in any suitable manner in one or more alternative embodiments.

DETAILED DESCRIPTION

Electric power transmission and distribution systems may utilize accurate time information to perform various monitoring, protection, and communication tasks. In connection with certain applications, intelligent electronic devices (IEDs) and network communication devices may utilize time information accurately beyond the millisecond range. IEDs within a power system may be configured to perform metering, control, and protection functions that require a certain level of precision between one or more IEDs. For example, IEDs may be configured to calculate and communicate time-synchronized phasors (synchrophasors), which may require that the IEDs and network devices be synchronized to within nanoseconds of each other. Many protection, metering, control, and automation algorithms used in power systems may benefit from or require receipt of accurate time information.

IEDs, network devices, and other devices in a power system may include local oscillators or other time sources and may generate a local time signal. In some circumstances, however, external time signals may be more accurate and may therefore be preferred over local time signals. A power system may include a data communications network that transmits a common time reference to time dependent devices connected to the data communications network. The common time reference may be received or derived from an accurate external time signal.

According to various embodiments, time-dependent devices may be configured to rely on a best available time signal, when available, and may be configured to enter a holdover period when the best available time signal is unavailable. Further, when multiple time sources are available during a holdover period, a best available time source may be selected from among the available time sources. A time signal generated by the best-available time source may be distributed to other time-dependent devices. The best-available time source may be determined by time signal verification and may be performed by classifying the time signal, evaluating the specified accuracy, verifying stability, and measuring various accuracy characteristics, and comparing with specified accuracy characteristics.

In some embodiments, a device may be configured to monitor the drift of a local time source with respect to an external time source and to retain information regarding the drift rate. In various embodiments, the drift rate may be influenced by a temperature at which the time source operates (i.e., a temperature-dependent error component) and by a time-dependent component. Information about a maximum error of the time signal may be distributed to time-dependent devices during a holdover period. A receiving device may use the information about the maximum error to determine whether the time signal satisfies an accuracy requirement of the device. If the time signal accuracy satisfies the accuracy requirement, the time signal information may be used. If the time signal accuracy fails to satisfy the accuracy requirement, the time signal may be discarded.

Reference throughout this specification to "one embodiment" or "an embodiment" indicates that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. In particular, an "embodiment" may be a system, an article of manufacture (such as a computer readable storage medium), a method, and/or a product of a process.

The phrases "connected to," "networked," and "in communication with" refer to any form of interaction between two or more entities, including mechanical, electrical, magnetic, and electromagnetic interaction. Two components may be connected to each other, even though they are not in direct physical contact with each other and even though there may be intermediary devices between the two components.

Some of the infrastructure that can be used with embodiments disclosed herein is already available, such as: general-purpose computers, computer programming tools and techniques, digital storage media, and optical networks. A computer may include a processor such as a microprocessor, microcontroller, logic circuitry, or the like. The processor may include a special purpose processing device such as an ASIC, PAL, PLA, PLD, Field Programmable Gate Array, or other customized or programmable device. The computer may also include a computer readable storage device such as: non-volatile memory, static RAM, dynamic RAM, ROM, CD-ROM, disk, tape, magnetic, optical, flash memory, or other computer readable storage medium.

A common time reference refers to a time signal or time source relied on by a plurality of devices, and which is presumed to be more accurate than a local time source. The determination of accuracy may be made based upon a variety of factors. A common time reference may allow for specific moments in time to be described and temporally compared to one another.

A time source is any device that is capable of tracking the passage of time. A variety of time sources are contemplated, including: a voltage-controlled temperature compensated crystal oscillator (VCTCXO), a phase locked loop oscillator, a time locked loop oscillator, a rubidium oscillator, a cesium oscillator, a microelectromechanical device (MEM), an oven controlled crystal oscillator (OCXO), a temperature compensated crystal oscillator (TCXO), and/or other device capable of tracking the passage of time. As may be appreciated, it may not be economical to include in each device a local time source that is sufficiently accurate for performing certain functions, such as generating synchrophasors. Accordingly, a single accurate time source may generate a common time reference signal that is disseminated to a variety of connected devices.

A time signal is a representation of the time indicated by a time source. A time signal may be embodied as any form of communication for communicating time information. A wide variety of types of time signals are contemplated, including: an Inter-Range Instrumentation Group (IRIG) protocol, a Global Navigation Satellite System (GNSS), a radio broadcast such as a National Institute of Science and Technology (NIST) broadcast (e.g., radio stations WWV, WWVB, and WWVH), the IEEE 1588 protocol, a network time protocol (NTP) codified in RFC 1305, a simple network time protocol (SNTP) in RFC 2030, C37.238 and/or another time transmission protocol or system. NTP and SNTP precision is limited to the millisecond range, thus making it inappropriate for sub-millisecond time distribution applications. Both protocols lack security and are susceptible to malicious network attacks. The IEEE 1588 standard includes hardware-assisted timestamps, which allow for time accuracy in the nanosecond range. Such precision may be sufficient for more demanding applications (e.g., the sampling of the sinusoidal currents and voltages on power lines to calculate "synchrophasors"). It is well suited for time distribution at the communication network periphery, or among individual devices within the network.

It is of note that even the most accurate time signals may exhibit small discrepancies. For example, various clocks may exhibit microsecond level time offsets depending on the length and routing of a cable connected to a time source. Some of these offsets may be compensated by the user entering compensation settings, or may need to be estimated by the time synchronization network.

The described features, operations, or characteristics may be combined in any suitable manner in one or more embodiments. It will also be readily understood that the order of the steps or actions of the methods described in connection with the embodiments disclosed herein may be changed, as would be apparent to those skilled in the art. Thus, any order in the drawings or detailed description is for illustrative purposes only and is not meant to imply a required order, unless specified to require an order.

In the following description, numerous details are provided to give a thorough understanding of various embodiments. One skilled in the relevant art will recognize, however, that the embodiments disclosed herein can be practiced without one or more of the specific details, or with other methods, components, materials, etc. In other instances, well-known structures, materials, or operations are not shown or described in detail to avoid obscuring aspects of this disclosure.

FIG. 1 illustrates an example of an embodiment of a simplified one-line diagram of an electric power delivery system 100 with various substations consistent with embodiments of the present disclosure. Electric power delivery system 100 may be configured to generate, transmit, and distribute electric energy to loads. Electric power delivery systems may include equipment, such as electric generators (e.g., generators 110, 112, 114, and 116), power transformers (e.g., transformers 117, 120, 122, 130, 144 and 150), power transmission and delivery lines (e.g., lines 124, 134, 158), circuit breakers (e.g., breakers 152 and 160), busses (e.g., busses 118, 126, 132, 148), loads (e.g., loads 140, and 138) and the like. A variety of other types of equipment may also be included in electric power delivery system 100, such as voltage regulators, capacitor banks, and a variety of other types of equipment.

Substation 119 may include a generator 114, which may be a distributed generator, and which may be connected to bus 126 through step-up transformer 117. Bus 126 may be connected to a distribution bus 132 via a step-down transformer 130. Various distribution lines 136 and 134 may be connected to distribution bus 132. Distribution line 136 may lead to substation 141 where the line is monitored and/or controlled using IED 106, which may selectively open and close breaker 152. Load 140 may be fed from distribution line 136. Further step-down transformer 144 may be used to step down a voltage for consumption by load 140.

Distribution line 134 may also lead to substation 151, and deliver electric power to bus 148. Bus 148 may also receive electric power from distributed generator 116 via transformer 150. Distribution line 158 may deliver electric power from bus 148 to load 138, and may include further step-down transformer 142. Circuit breaker 160 may be used to selectively connect bus 148 to distribution line 134. IED 108 may be used to monitor and/or control circuit breaker 160 as well as distribution line 158.

Electric power delivery system 100 may be monitored, controlled, automated, and/or protected using intelligent electronic devices (IEDs), such as IEDs 104, 106, 108, 115, and 170, and a central monitoring system 172. According to various embodiments, central monitoring system 172 may comprise one or more of a variety of types of systems. For example, central monitoring system 172 may include a supervisory control and data acquisition (SCADA) system and/or a wide area control and situational awareness (WACSA) system.

As used herein, an IED (such as IEDs 104, 106, 108, 115, and 170) may refer to any microprocessor-based device that monitors, controls, automates, and/or protects monitored equipment within system 100. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, and the like. The term IED may be used to describe an individual IED or a system comprising multiple IEDs.

A central IED 170 may be in communication with IEDs 104, 106, 108, and 115. IEDs 104, 106, 108 and 115 may be remote from the central IED 170, may communicate over various media such as a direct communication from IED 106 or over a wide-area communications network 162. According to various embodiments, certain IEDs may be in direct communication with other IEDs (e.g., IED 104 is in direct communication with central IED 170) or may be communication via a communication network 162 (e.g., IED 108 is in communication with central IED 170 via communication network 162).

Communication via network 162 may be facilitated by networking devices including, but not limited to, multiplexers, routers, hubs, gateways, firewalls, and switches. In some embodiments, IEDs and network devices may comprise physically distinct devices. In other embodiments, IEDs and network devices may be composite devices, or may be configured in a variety of ways to perform overlapping functions. IEDs and network devices may comprise multi-function hardware (e.g., processors, computer-readable storage media, communications interfaces, etc.) that can be utilized in order to perform a variety of tasks that pertain to network communications and/or to operation of equipment within system 100.

The electric power delivery system 100 illustrated in FIG. 1 may include a generation substation 111. Substation 111 may include various generators 110 and 112 connected to a bus 118 through step-up transformers 120 and 122. Bus 118 may be connected to bus 126 in substation 119 via transmission line 124. Although the equipment in substation 111 may be monitored and/or controlled by various IEDs, only a single IED 104 is shown. IED 104 may be a transformer protection IED for transformer 120.

A common time signal may be distributed throughout system 100. Utilizing a common or universal time source may ensure that IEDs have a synchronized time signal that can be used to generate time synchronized data, such as synchrophasors. In various embodiments, IEDs 104, 106, 108, 115, 170 may receive a common time signal 168. The time signal may be distributed in system 100 using a communications network or using a universal time source, such as a GNSS, or the like.

Central IED 170 may comprise a local time source 174 that generates a local time signal. The local time source 174 may comprise a voltage-controlled temperature compensated crystal oscillator (VCTCXO), a phase locked loop oscillator, a time locked loop oscillator, a rubidium oscillator, a cesium oscillator, a microelectromechanical device (MEM), oven controlled crystal oscillator (OCXO), and temperature compensated crystal oscillator (TCXO), and/or other device capable of tracking the passage of time.

During periods of time in which the common time signal 168 and the local time source 174 are concurrently operational, a model may be created of the behavior of the local time source 174 with respect to the common time signal 168. The model may, in various embodiments, account for variations that occur over time and for variations based on variations in temperature. A time-dependent drift rate may be determined by comparisons of the local time source 174 to the common time signal 168 over a span of time. In some embodiments, a model may be developed that determines a maximum time-dependent error for a given length of time. Development of the model may occur during long periods of "quiet" operation (i.e., periods in which the external time signal is available for comparison with the local oscillator). In other embodiments, a model may be predetermined. For example, a model may be developed based on various sources of information, such as testing on a representative part or information provided by a manufacturer.

In various embodiments, the drift rate of the local time source may be influenced by temperature. The central IED 170 may determine a temperature-dependent signal drift rate of the local time source 174 relative to the common time signal 168 based on comparisons of the local time signal to an external time signal at a plurality of temperatures. In some embodiments, a model may be developed that determines a maximum temperature-dependent error based on a current temperature. In one embodiment, the model may rely on a current temperature in proximity to the local time source. In other embodiments, a current temperature and a history of previous temperatures may be used by a model that determines the maximum temperature-dependent error.

Figure 2:
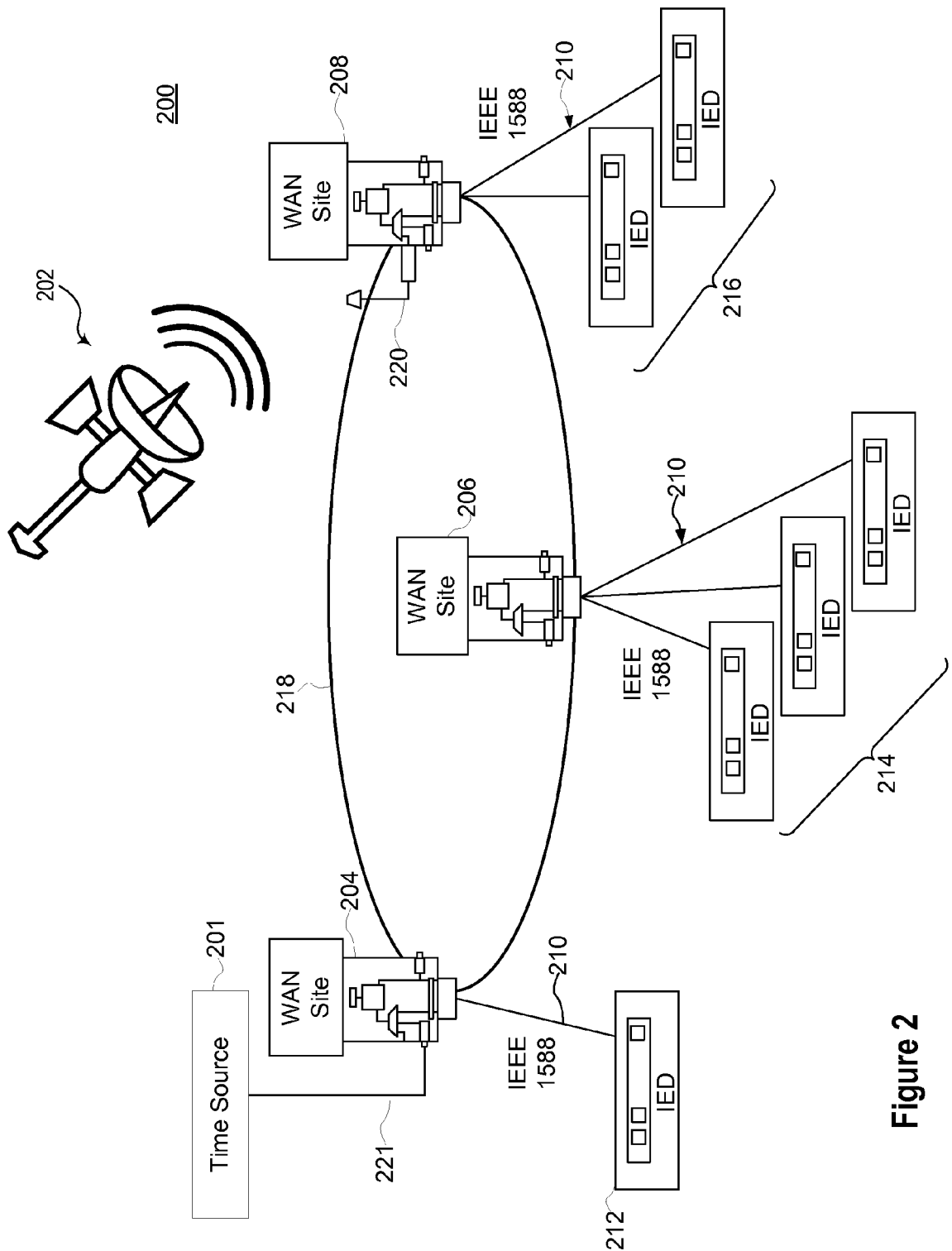
FIG. 2 illustrates a time distribution system including communication IEDs configured to distribute a common time reference to various IEDs consistent with embodiments of the present disclosure.

FIG. 2 illustrates a time distribution system including communication IEDs configured to distribute a common time reference to various IEDs consistent with embodiments of the present disclosure. System 200 may be configured to utilize one or more of the methods described herein. System 200 is configured to be a highly reliable, redundant, and distributed system of time dependent IEDs 212, 214, and 216 capable of receiving a common time reference. Each WAN Site 204, 206, and 208 may be configured to receive and communicate time signals through multiple protocols and methods. While the system 200 is described as being capable of performing numerous functions and methods, it should be understood that various systems are possible that may have additional or fewer capabilities. Specifically, a system 200 may function as desired using only one protocol, or having fewer external or local time signal inputs.

In the illustrated embodiment, three WAN sites 204, 206, and 208 are communicatively connected to a WAN 218, which may comprise one or more physical connections and protocols. Each WAN site 204, 206, and 208 may also be connected to one or more IEDs within a local network. WAN site 204 is connected to IED 212, WAN site 206 is connected to IEDs 214, and WAN site 208 is connected to IEDs 216. A WAN site may be, for example, a power generation facility, a distribution hub, a load center, or other location where one or more IEDs are found. In various embodiments, an IED may include a WAN port, and such an IED may be directly connected to WAN 218. IEDs may be connected via WAN 218 or LANs 210. WAN sites 204, 206, and 208 may establish and maintain a common time reference among various system components. Each WAN site 204, 206, and 208 may be configured to communicate time information with IEDs connected on its LAN through one or more time distribution protocols, such as IEEE 1588.

Time source 201 may comprise one or more VCTCXOs, phase locked loop oscillators, time locked loop oscillators, rubidium oscillators, cesium oscillators, NIST broadcasts (e.g., WWV and WWVB), and/or other devices capable of generating accurate time signals. Time source 201 may be connected to WAN site 204 using a cable 221. In the illustrated embodiment, WAN site 208 includes an antenna 220 configured to receive a GNSS signal 202. As illustrated, WAN site 206 does not directly receive an external time signal, however, according to alternative embodiments, any number and variety of external time signals may be available to any number of communication IEDs. A common time reference may be conveyed using any number of time communication methods including IRIG protocols, NTP, SNTP, synchronous transport protocols (STP), and/or IEEE 1588 protocols.

During periods of typical operation, the GNSS time signal 202 may be compared to the time signal generated by time source 201. A model may be created of the behavior of the time source 201 with respect to the GNSS time signal 202. The model may, in various embodiments, account for variations that occur over time and for variations based on variations in temperature. A time-dependent drift rate may be determined by comparisons of the time source 201 to the GNSS time signal 202 over a span of time. In some embodiments, a model may be developed that determines a maximum time-dependent error for a given length of time.

If communication to the external time signals 201 and 202 is disrupted, system 200 may enter a holdover period until communication is restored. During the holdover period, the model developed regarding the time source 201 may be used in connection with the time signal generated by time source 201 to generate an estimation of the error of the time source 201 and to correct the time signal to reduce the error.

The time signal generated by time source 201 may be distributed during the holdover period to the other WAN sites 206 and 208. In turn, WAN sites 206 and 208 may transmit the time signal to IEDs 214 and 216, respectively. In addition to transmission of the time signal, an estimate of the error of the time signal may also be transmitted. A device receiving the time signal in system 200 may use the estimate of the error to determine whether the time signal satisfies a level of precision associated with the device. In one embodiment, a table of drift rates and temperature may be utilized to determine an error associated with the time signal. In some embodiments, the temperature dependent drift rate may be valid within a specific temperature range (e.g., between around 10 C to 50 C). If the temperature falls outside of the specific temperature range, an alternative drift rate may be used.

Upon resumption of communication with GNSS time signal 202, the GNSS time signal 202 may again be distributed to devices in system 200. In some embodiments correction of the time signal distributed in system 200 may occur over a period of time. In other words, any discrepancy between the time according to time source 201 and GNSS time source 202 may be eliminated over a period of time.

Figure 3:
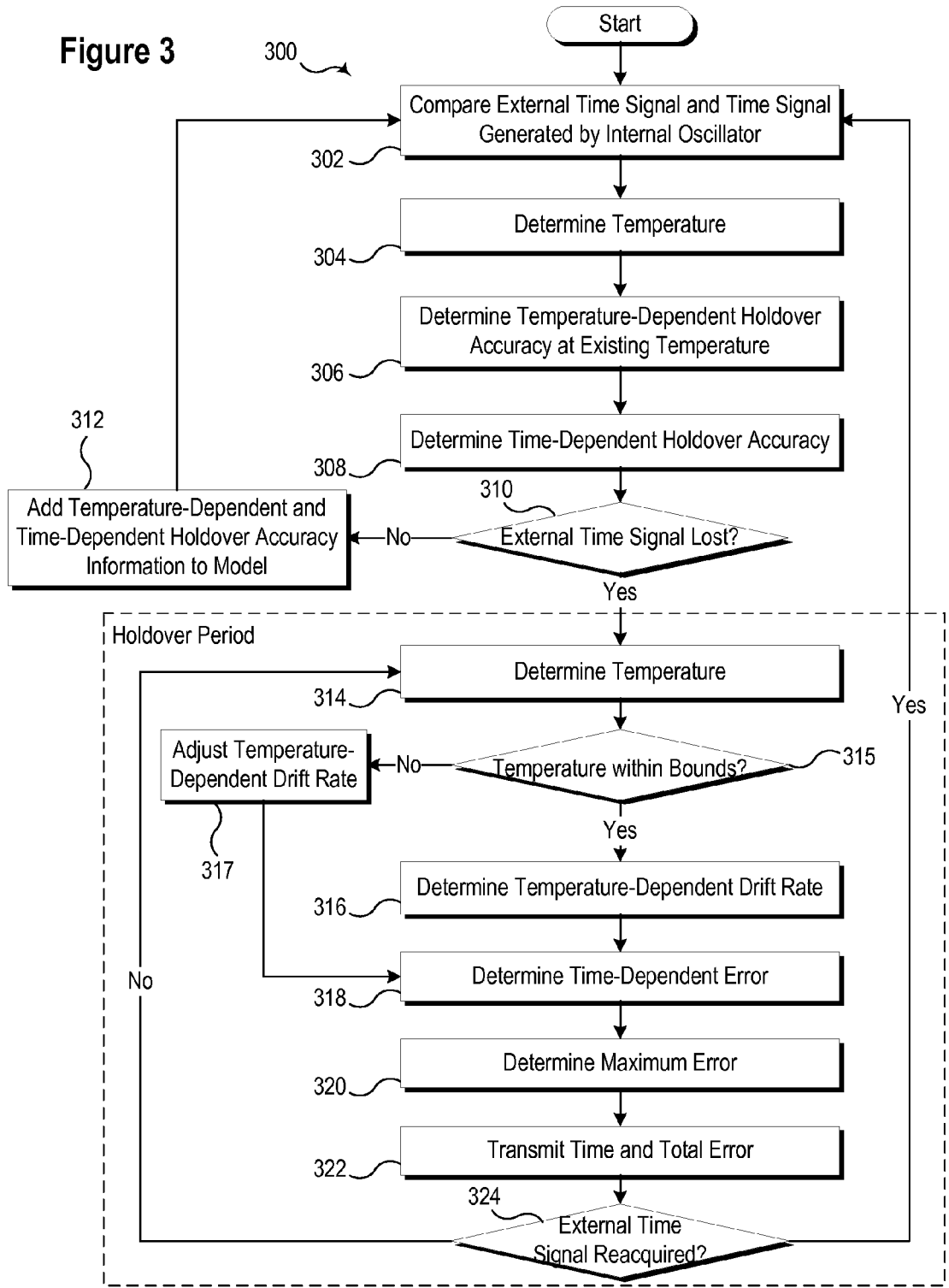
FIG. 3 illustrates a flow chart of a method for adaptive holdover timing error estimation and correction consistent with embodiments of the present disclosure.

FIG. 3 illustrates a flow chart of a method 300 for adaptive holdover timing error estimation and correction consistent with embodiments of the present disclosure. At 302, an external time signal may be compared to a time signal generated by an internal oscillator. In various embodiments, the internal oscillator may be a part of a time source subsystem configured to perform various features described in connection with FIG. 3. The comparison may be made during a period of time in which the time signal generated by the internal oscillator and the external time signal are both available. At 304, a temperature may be determined. At 306, a temperature-dependent holdover accuracy may be determined at the existing temperature (i.e., the temperature determined at 304). At 308, a time-dependent holdover accuracy may be determined. At 310, it may be determined whether receipt of the external time signal has been lost. If the external time signal has not been lost, method 300 may proceed to 312.

The determination of the temperature-dependent holdover accuracy at the existing temperature and the determination of the time-dependent holdover accuracy may provide a specific data point that may be added to a model at 312. In some embodiments, the model may correlate the plurality of points into a mathematical representation that equates a component of the error in the time signal generated by the internal oscillator to a function of the temperature in which the internal oscillator operates. In some embodiments, the temperature readings may be averaged over time to reduce the effect of spurious temperature readings. The average may, in various embodiments, be a moving average or a windowed moving average.

In some embodiments, a generalized form of the maximum temperature-dependent error may be expressed in the form of Eq. 1.

$$\sum_{start\,of\,holdover}^{present} \left( \text{Temp. Dependent Drift Rate} \left( \frac{\text{ns}}{\frac{\text{sec}}{^\circ\text{C.}}} \right) * \text{Temp. Change}(^\circ\text{C.}) * \text{Calculation Interval(sec)} \right) = \text{Max. Temp. Dependent Error Estimate (ns)} \qquad \text{Eq. 1}$$

Although Eq. 1 expresses the maximum error as the summation of the products of the drift rate and an observed temperature change in each calculation interval, in various embodiments, the precise nature of the relationship between temperature and the maximum error may vary based on a number of factors, including the type of oscillator. A determination of the maximum error may be performed on a periodic basis. Each determination may be added to a total estimated error. Accordingly, in some embodiments, the relationship may be better expressed as a linear function, a logarithmic function, a polynomial function, an exponential function, etc.

In addition to creating a model for the maximum error attributable to a temperature-dependent function of the local oscillator, a maximum time-dependent error may also be created. In some embodiments, the model may correlate a plurality of data points into a mathematical representation that equates a component of the error in the time signal generated by the internal oscillator to a function of the time with respect to the external time signal.

In some embodiments, a generalized form of the maximum time-dependent error may be expressed in the form of Eq. 2.

$$\text{Drift Rate} * \text{Holdover Duration} = \text{Max. Error} \qquad \text{Eq. 2}$$

Although Eq. 2 expresses the maximum error as a product of a drift rate and a holdover duration, in various embodiments, the precise nature of the relationship between drift rate, the holdover duration, and the maximum error may vary based on a number of factors, including the type of oscillator. Accordingly, in some embodiments, the relationship may be better expressed as a linear function, a logarithmic function, a polynomial function, an exponential function, etc.

If method 300 determines that the external time signal is lost at 310, a holdover period may begin. During the holdover period, the temperature may be determined at 314. At 315, it may be determined whether the temperature determined at 314 is within bounds (i.e., falls within a particular temperature range). In various embodiments, a temperature-dependent model may only be valid over a certain temperature range, such as an oscillator's operating temperature range or the temperature range in which data has been collected.

If the temperature is determined to be out of bounds at 315, an adjusted temperature-dependent drift rate may be determined at 317. The adjusted temperature-dependent drift rate may apply a larger a larger drift rate or may identify an error. In some versions of IRIG protocols, an estimated error indication may be set to a "failed" status. Still further, in some embodiments, the output may simply be turned off.

If the temperature is determined to within bounds at 315, a temperature-dependent drift rate may be determined at 316. In one specific example, using a plurality of temperature measurements and comparisons to the external time signal, it may be determined that the internal oscillator has a maximum temperature-dependent error of about $$20 \frac{PPB}{{}^\circ C.}$$

in comparison to a baseline temperature. Accordingly, a change in temperature of +0.25° C. during the holdover period in comparison to the baseline temperature would cause a temperature-dependent drift rate as set forth in Eq. 3.

$$20 \frac{PPB}{{}^\circ C.} * 0.25^\circ C. = 5 PPB \qquad \text{Eq. 3}$$

In this case, the maximum estimated temperature-dependent timing error would increase at a rate of 5 PPB, or 5 ns/s due to the change in the operating temperature of the local oscillator. If the temperature continued to increase in this example, the drift rate could further increase to reflect the additional uncertainty in the oscillator's stability.

At 318, a time-dependent error may be determined. In one specific example, method 300 may determine that the internal oscillator has a maximum time-dependent error of about $3.0*10^{-10}*(\text{seconds in holdover})^{1.30}$ in comparison to a baseline temperature using a plurality of measurements prior to the beginning of the holdover period. Accordingly, after a period of 86,400 seconds (i.e., one day) the time-dependent maximum error could be determined as set forth in Eq. 4.

$$3.0*10^{-10}*(86400 \text{ seconds})^{1.30} = 785 \text{ μs} \qquad \text{Eq. 4}$$

In this specific example, the maximum estimated time-dependent error would be 785 μs after one day.

At 320, a maximum error that accounts for the temperature-dependent error and the time-dependent error may be determined. A generalized form of the maximum total error may be expressed in the form of Eq. 5.

Time-Dep. Error+Temp.-Dep. Error=Total Error    Eq. 5

The total error determined using Eq. 5 may be transmitted to devices receiving the time signal generated by the local oscillator at 322. Using information regarding the maximum error, a receiving device may determine whether the time signal satisfies the accuracy requirements of the device.

In one specific embodiment, the total error may be transmitted in a format that succinctly specifies the accuracy of the time signal. In one specific embodiment, the accuracy may be specified in a clock accuracy enumeration field in the format set forth in Table 1.

TABLE 1

| Value (Hex) | Specification |
|---|---|
| 00-1F | Reserved |
| 20 | The time is accurate to within 25 ns |
| 21 | The time is accurate to within 100 ns |
| 22 | The time is accurate to within 250 ns |
| 23 | The time is accurate to within 1 μs |
| 24 | The time is accurate to within 2.5 μs |
| 25 | The time is accurate to within 10 μs |
| 26 | The time is accurate to within 25 μs |
| 27 | The time is accurate to within 100 μs |
| 28 | The time is accurate to within 250 μs |
| 29 | The time is accurate to within 1 ms |
| 2A | The time is accurate to within 2.5 ms |
| 2B | The time is accurate to within 10 ms |
| 2C | The time is accurate to within 25 ms |
| 2D | The time is accurate to within 100 ms |
| 2E | The time is accurate to within 250 ms |
| 2F | The time is accurate to within 1 s |
| 30 | The time is accurate to within 10 s |
| 31 | The time is accurate to within >10 s |

In embodiments utilizing the IEEE 1588 protocol, information regarding the clock may be incorporated into a clockAccuracy enumeration field set forth in sub-clause 7.6.2.5, table 6. Certain IRIG protocols may transmit similar data about a time source's accuracy, although such protocols may utilize different names and/or formats, as specified by various protocols.

At 324, method 300 may determine whether the external time signal has been reacquired. If so, method 300 may return to 302. If not, method 300 may continue to operate in the holdover mode and may return to 314. Operation in the holdover mode may persist for long period or a short a period, as dictated by the availability of the external time signal.

Figure 4:
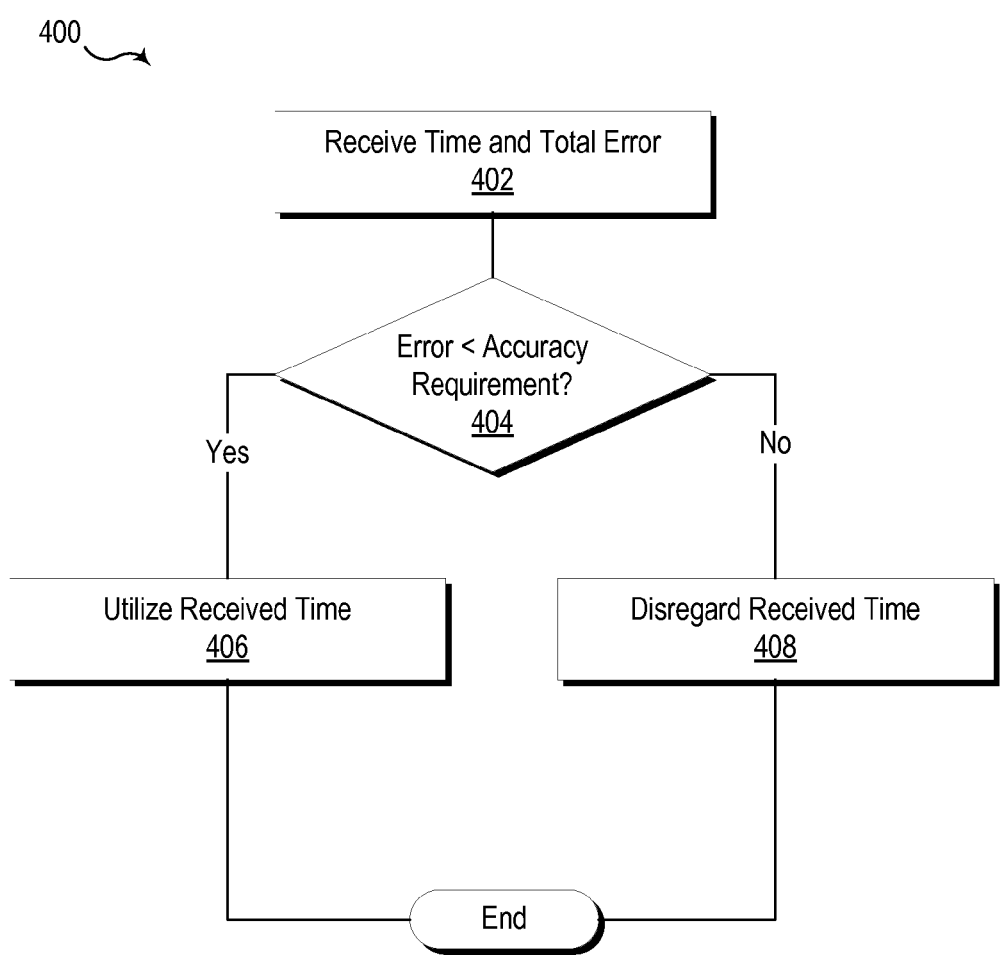
FIG. 4 illustrates a flow diagram of one embodiment of a method for receiving a time signal including an indication of the accuracy of a time signal.

FIG. 4 illustrates a flow diagram of one embodiment of a method 400 for receiving a time signal including an indication of the accuracy of a time signal. In some embodiments the indication of the accuracy of the time signal may be expressed in a format consistent with the format indicated above in Table 1. In other embodiments, a variety of formats may be used to communicate the accuracy of the time signal. At 402, a receiving device may receive a time signal and an estimate of a total error of the time signal. As discussed previously, the estimate of the total error may comprise an estimate of a time-dependent component and a temperature-dependent component of the error.

In various embodiments, a receiving device may comprise an IED, a computer system, a phasor data concentrator, a remote terminal unit, a differential relay, a distance relay, a directional relay, a feeder relay, an overcurrent relay, a voltage regulator control, voltage relays, a breaker failure relay, a generator relay, a motor relay, an automation controller, a bay controller, a power meter, a recloser control, a communications processor, a programmable logic controller, a programmable automation controller, an input and output module, and the like.

At 404, the receiving device may determine whether the total error is less than an accuracy requirement of the receiving device. The accuracy requirement may vary depending on the device and/or the function performed by a device. For example, a device configured to utilize synchrophasors may require accuracy on the order of tens of nanoseconds. Other devices may have less stringent time requirements. For example, an IED configured to perform disturbance recording or sequence-of-events recording may require accuracy on the order of microseconds. Still other devices, such as intelligent power meters, may require a significantly less precise time signal. If the time information satisfies the accuracy requirements of the receiving device, the received time information may be utilized at 406. On the other hand, if the time information fails to satisfy the accuracy requirements, the received time information may be disregarded at 408. When communication with the external time signal is restored, a system implementing method 400 system may revert back to using the external time source.

Aspects of certain embodiments described herein may be implemented as software modules or components. As used herein, a software module or component may include any type of computer instruction or computer executable code located within a computer readable storage medium. A software module may, for instance, comprise one or more physical or logical blocks of computer instructions, which may be organized as a routine, program, object, component, data structure, etc., that performs one or more tasks or implements particular abstract data types.

In certain embodiments, a particular software module may comprise disparate instructions stored in different locations of a computer readable storage medium, which together implement the described functionality of the module. Indeed, a module may comprise a single instruction or many instructions, and may be distributed over several different code segments, among different programs, and across several computer readable storage media. Some embodiments may be practiced in a distributed computing environment where tasks are performed by a remote processing device linked through a communications network. In a distributed computing environment, software modules may be located in local and/or remote computer readable storage media. In addition, data being tied or rendered together in a database record may be resident in the same computer readable storage medium, or across several computer readable storage media, and may be linked together in fields of a record in a database across a network.

The software modules described herein tangibly embody a program, functions, and/or instructions that are executable by computer(s) to perform tasks as described herein. Suitable software, as applicable, may be readily provided by those of skill in the pertinent art(s) using the teachings presented herein and programming languages and tools, such as XML, Java, Pascal, C++, C, database languages, APIs, SDKs, assembly, firmware, microcode, and/or other languages and tools.

Figure 5A:
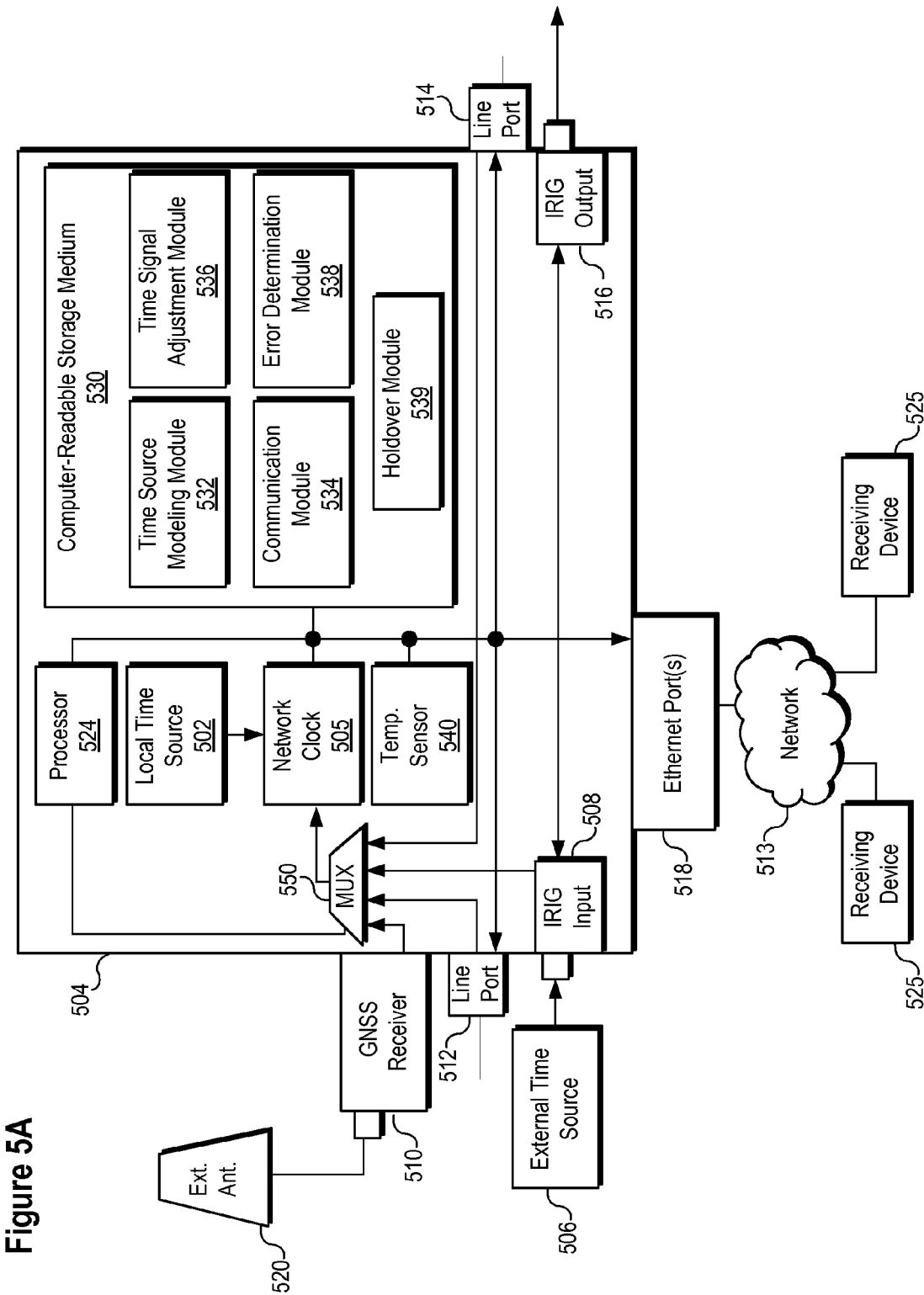
FIG. 5A illustrates a WAN communications module configured to compare a time signal generated by a local time source to an external time signal and to develop a model for estimating an error of the local time source consistent with embodiments of the present disclosure.

FIG. 5A illustrates a WAN communications module 504 configured to compare a time signal generated by a local time source 502 to an external time signal and to develop a model for estimating an estimate of an error of the local time source 502 consistent with embodiments of the present disclosure. The WAN communications module 504 may include more or less functionality than the illustration in the present example. In some embodiments, for example, WAN communications module 504 may include an interface for monitoring equipment in an electric power distribution system in certain embodiments. Accordingly, in various embodiments WAN communications module may be implemented either as an IED or as a network device.

WAN communications module 504 includes a local time source 502 that provides a local time signal and a network clock 505 for generating a time signal based on the output of the local time source 502. WAN Communications module 504 further includes a pair of line ports 512 and 514 for communications with a WAN or LAN. Time information may be shared over a network and may also be fed into the network clock 505. Further, WAN communications module 504 includes a GNSS receiver 510 for receiving a common time reference signal, such as time from a GNSS via a GNSS antenna 520. GNSS receiver 510 may be in communication with the GNSS antenna 520. The received common time reference signal may also be communicated to the network clock 505.

Another time source that may be fed to the network clock 505 includes an external time source 506 that may conform to a time distribution protocol, such as IRIG. The external time source 506 may communicate with another time port such as an IRIG input 508.

A processor 524 may be configured to process communications received via Ethernet ports 518, line port 512, network clock 505, and computer-readable storage medium 530. Processor 524 may operate using any number of processing rates and architectures. Processor 524 may be configured to perform various algorithms and calculations described herein using computer executable instructions stored on computer-readable storage medium 530. Processor 524 may be embodied as a general purpose integrated circuit, an application specific integrated circuit, a field-programmable gate array, and/or other programmable logic devices.

The various time information from the WAN (from line ports 512 and/or 514), GNSS receiver 510, and IRIG input 508 may be brought into a multiplexor (MUX) 550 before time information is brought into the network clock 505. The network clock 505 functions to determine a common time reference for use by the various devices connected to WAN communications module 504. Time information is then communicated from the network clock 505 to various receiving devices 525 via network 513. In some embodiments, the time information may be communicated to the receiving devices 525 using a variety of protocols, such as IEEE 1588. The Ethernet ports 518 may also include network communications to the various devices connected to WAN communications module 504.

WAN communications module 504 may further comprise a temperature sensor 540. The temperature sensor 540 may be used to determine an operating temperature of the local time source 502. Temperature measurements obtained from temperature sensor 540 may be used to develop a temperature-dependent model that may be used to estimate a temperature-dependent error of the local time source 502.

In addition to the features implemented by the specific hardware illustrated in FIG. 5A, various features may also be implemented using computer modules stored on computer-readable storage medium 530. The computer-readable storage medium may comprise a non-volatile storage device. In some embodiments, a time-source modeling module 532 may be configured to develop a model configured to generate an estimate of an error, which may include a time-dependent error and a temperature-dependent error.

WAN communication module 534 may include instructions for facilitating communication of information from WAN communications module to other IEDs and/or other components in an electric power delivery system using, for example, Ethernet Port(s) 518 and IRIG Output 516. The communication module 534 may include instructions on the formatting of communications according to a predetermined protocol. Such a protocol may include the IRIG protocol, the IEEE 1588 protocol, the network time protocol (NTP), the simple network time protocol (SNTP), the C37.238 protocol and/or another time transmission protocol or system.

A time signal adjustment module 536 may be used to correct a time signal received from a variety of time sources.

The time signal adjustment module 536 may also communicate time signals according to a variety of protocols. Such protocols may include IRIG protocols, IEEE 1588, Network Time Protocol, Simple Network Time Protocol, synchronous transport protocol, and the like. In certain embodiments, the time signal adjustment module 536 may generate one or more corrected time signals by advancing one or more reference indications included in a common time signal. The time signal adjustment module 536 may be configured to adjust a time signal distributed by the WAN communication module 534 at the conclusion of a holdover period. In some embodiments, the time signal adjustment module 536 may be configured to adjust a time signal during a holdover period based on a predicted error associated with the local time source 502.

An error determination module 538 may be configured to estimate an error associated with a time signal based on the local time source 502. In one specific embodiment, the error determination module 538 may be configured to implement the following pseudo-code.

```
maxTempDiff = max(abs((temp at holdover start) – previous256temps))
startingTemperature = 30 second moving average of previousTemps (when holdover started)
for every second in holdover:
currentTemperature = 30 second moving average of previousTemps (now)
tempChange = abs(currentTemperature – startingTemperature)
If (tempChange =< 4.75)& (15 =< startingTemperature =< 55) ) //restricts starting temp and tempChange allowed
    baselineDriftRate = 1.3*3*10^–10*(seconds in holdover)^0.30
    tempDriftRate = 20.8*10^–9* (tempChange)
    if (tempDriftRate > 40*10^–9) or maxTempDiff >=0.25
        tempDriftRate = 40*10^–9
    currentDriftRate = baselineDriftRate + tempDriftRate
else
    currentDriftRate = 280*10^–9
if currentDriftRate > driftRate
    driftRate = currentDriftRate
timing_error = timing_error + driftRate
```

Holdover module 539 may be configured to generate a time signal based on the local time source 502 that is suitable for distribution to one or more receiving devices, such as Ethernet devices 525. The holdover module 539, in various embodiments may be configured to detect loss of reception of the external time signal at the outset of a holdover period and resumption of the reception of the external time signal at the end of the holdover period. The holdover module 539 may further be configured to transmit an estimated total maximum error to the receiving devices together with the time signal. In one specific embodiment, the holdover module 539 may implement the method illustrated in FIG. 2 and described in detail above.

Returning to a discussion of FIG. 5A, although the time source modeling module 532, the communication module 534, the time signal adjustment module 536, the error determination module 538, and the holdover module 539 are shown as software modules in the illustrated embodiment, the functions associated with these modules may be implemented in hardware in various embodiments. In various embodiments, the functions described in connection with the various modules may be performed by various subsystems implemented in hardware, software, or a combination of hardware and software.

Figure 5B:
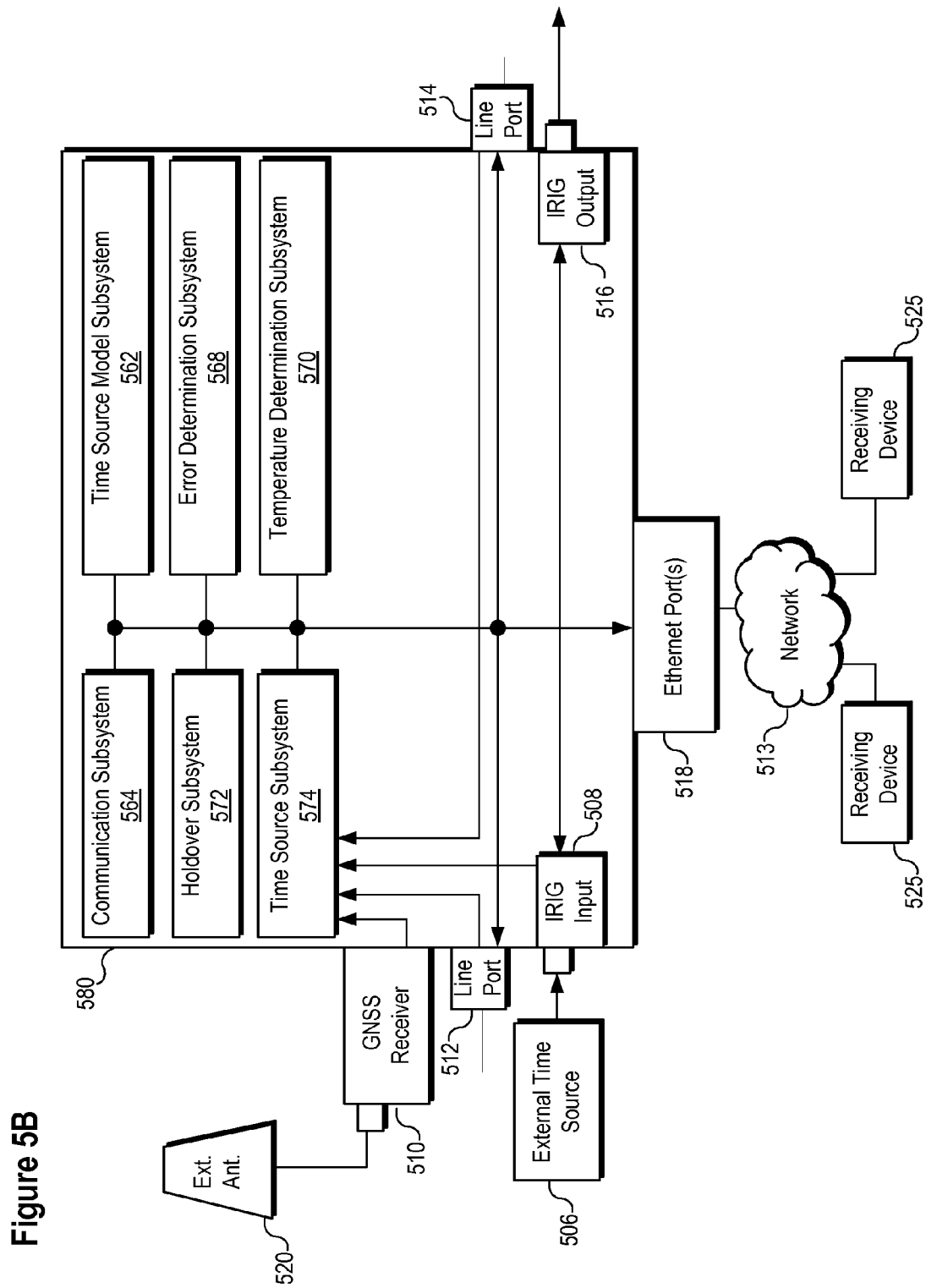
FIG. 5B illustrates another embodiment of a WAN communications with a plurality of inputs similar to the WAN communications module in FIG. 5A consistent with embodiments of the present disclosure.

FIG. 5B illustrates another embodiment of a WAN communications module 580 with a plurality of inputs similar to the WAN communications module in FIG. 5A consistent with embodiments of the present disclosure. WAN communications module 580 may include various subsystems used to receive, analyze, model, and/or transmit time information.

WAN communications module 580 may include a time source subsystem 574. The time source subsystem 574 may be configured to generate a time signal that is suitable for distribution to one or more receiving devices, such as Ethernet devices 525. In various embodiments, the time source subsystem 574 may include a local time source. The time source subsystem 574 may be configured to compare a time signal generated by the local time source to an external time signal (e.g., a signal received from GNSS receiver 510, line port 514, or external time source 506) and determine a temperature-dependent signal drift rate and/or a time-dependent signal drift rate of the local time signal relative to the external time signal.

A communication subsystem 564 may facilitate communication of information from WAN communications module 580 to other IEDs and/or other components in an electric power delivery system using, for example, Ethernet Port(s) 518 and IRIG Output 516. The communication subsystem 564 may be configured to communicate according to a predetermined protocol. Such a protocol may include the IRIG protocol, the IEEE 1588 protocol, the network time protocol (NTP), the simple network time protocol (SNTP), the C37.238 protocol and/or another time transmission protocol or system.

A time source model subsystem 562 may be configured to develop a model configured to generate an estimate of an error associated with a time signal generated by the time source subsystem 574. The time source module subsystem 562 may be configured to develop a time-dependent error model and/or a temperature-dependent error model. In various embodiments, a model may be created using a variety of techniques. In some embodiments, a data model may be generated using a plurality of measurements. In other embodiments, the data model may be created from a manufacturer's datasheet, from testing done on a representative unit, during manufacturing, and the like. The model may include a table representing maximum drift rate estimates in comparison to an oscillator temperature. Such techniques may be applicable to development of either a time-dependent model or a temperature-dependent model. Such models may be developed during the operation of a clock in some embodiments, while in other embodiments, the model may be developed prior to installation in a system.

An error determination subsystem 562 may be configured to estimate an error associated with a time signal based on the time source subsystem 574 using one or more models developed by time source model subsystem 562.

An error determination subsystem 568 may be configured to estimate an error associated with a time signal based on the time source subsystem 574. The error determination subsystem may be configured to estimate a total maximum error based on the estimated maximum time-dependent error and the estimated maximum temperature-dependent error.

A temperature determination subsystem 570 may be configured to determine a temperature in proximity to the time source subsystem 574. In various embodiments, the temperature determination subsystem 570 may be configured to provide temperature measurements that may be used by time source model subsystem 562 to develop a temperature-dependent model that may be used to estimate a temperature-dependent error of the time source subsystem 574.

A holdover subsystem 572, in various embodiments may be configured to detect loss of reception of the external time signal at the outset of a holdover period and resumption of the reception of the external time signal at the end of the holdover period. The holdover subsystem 572 may further be configured to estimate a maximum time-dependent error based on the time-dependent signal drift rate and a duration of the holdover period and to estimate a maximum temperature-dependent error based on a current temperature and the temperature-dependent signal drift rate. The holdover subsystem may be configured to transmit an estimated total maximum error to the receiving devices 525 together with the time signal. In one specific embodiment, the holdover subsystem 572 may implement the method illustrated in FIG. 2 and described in detail above.

The above description provides numerous specific details for a thorough understanding of the embodiments described herein. However, those of skill in the art will recognize that one or more of the specific details may be omitted, or other methods, components, or materials may be used. In some cases, operations are not shown or described in detail.

While specific embodiments and applications of the disclosure have been illustrated and described, it is to be understood that the disclosure is not limited to the precise configuration and components disclosed herein. Various modifications, changes, and variations apparent to those of skill in the art may be made in the arrangement, operation, and details of the methods and systems of the disclosure without departing from the spirit and scope of the disclosure.

What is claimed:

1. A system for adaptive holdover time error estimation, comprising:
   a local time source configured to generate a local time signal;
   an external time source interface configured to receive an external time signal;
   a temperature determination subsystem configured to determine a plurality of temperature measurements in proximity to the local time source at a corresponding plurality of times;
   a temperature-dependent model subsystem configured to develop a temperature-dependent model based on the plurality of temperature measurements and comparison of the local time signal to the external time signal at a corresponding plurality of times;
   a time-dependent model subsystem configured to develop a time-dependent model based on a plurality of comparisons of the local time signal to the external time signal at a corresponding plurality of times;
   a holdover subsystem configured to:
      detect a loss of reception of the external time signal during a holdover period;
      estimate a maximum time-dependent error based on the time-dependent model and a duration of the holdover period;
      estimate a maximum temperature-dependent error based on the temperature-dependent model;
      determine an estimated total maximum error based on the estimated maximum time-dependent error and the estimated maximum temperature-dependent error; and
   a communication system configured to transmit the local time signal and the estimated total maximum error to at least one receiving device.

2. A method of adaptive holdover duration time error estimation, the method comprising:
   generating a local time signal using a local time source;
   receiving an external time signal;
   losing reception of the external time signal during a holdover period;
   estimating a maximum time-dependent error based on a duration of the holdover period;
   estimating a maximum temperature-dependent error based on a current temperature;
   determining an estimated total maximum error based on the estimated maximum time-dependent error and the estimated maximum temperature-dependent error; and
   transmitting the local time signal and the estimated total maximum error to a receiving device.

3. The method of claim 2, further comprising:
   generating a temperature-dependent model of the local time source based on a plurality of temperature measurements and comparison of the local time signal to the external time signal at a corresponding plurality of times; and
   wherein the temperature-dependent model is used in estimating the maximum temperature-dependent error.

4. The method of claim 3, further comprising:
   determining an average of the plurality of temperature measurements; and
   using the average of the plurality of temperature measurements to estimate the maximum temperature-dependent error.

5. The method of claim 2, further comprising:
   generating a time-dependent model of the local time source based on a comparison of the local time signal to the external time signal over a temporal period; and
   wherein the time-dependent model is used in determining the maximum time-dependent error.

6. The system of claim 2, wherein the local time source comprises one of a voltage-controlled temperature compensated crystal oscillator, a phase locked loop oscillator, a time locked loop oscillator, a rubidium oscillator, a cesium oscillator, a microelectromechanical oscillator, an oven controlled crystal oscillator, and temperature compensated crystal oscillator.

7. The method of claim 2, wherein the external time signal comprises at least one of a Global Navigation Satellite System and a National Institute of Science and Technology radio broadcast.

8. The method of claim 2, wherein transmitting the local time signal and the estimated total maximum error to the receiving device comprises transmitting the local time signal according to a protocol chosen from one of the group consisting of an Inter-Range Instrumentation Group protocol, an IEEE 1588 protocol, a Network Time Protocol, a Simple Network Time Protocol, and a synchronous transport protocol.

9. The method of claim 2, wherein the estimated total maximum error is transmitted in a clock accuracy enumeration field.

10. The method of claim 2, further comprising:
    the receiving device receiving the local time signal and the estimated total maximum error;
    determining that the estimated total maximum error exceeds an accuracy requirement; and
    disregarding the local time signal.

11. The method of claim 2, further comprising:
    determining a temperature-dependent signal drift rate of the local time signal relative to the external time signal; and
    determining a time-dependent signal drift rate of the local time signal relative to the external time signal;
    wherein estimating the maximum time-dependent error is further based on the temperature-dependent signal drift rate and estimating the maximum temperature-dependent error is further based on the time-dependent signal drift rate.

12. The method of claim 2, further comprising:
determining that the current temperature falls outside of a bounded range; and
applying an adjustment to the maximum temperature-dependent error.

13. The method of claim 2, further comprising correcting the local time signal based on the estimated maximum time-dependent error and the estimated maximum temperature-dependent error.

14. A system configured for adaptive holdover time error estimation, comprising:
a local time source configured to generate a local time signal;
an external time source interface configured to receive an external time signal;
a holdover subsystem configured to:
  detect a loss of reception of the external time signal during a holdover period;
  estimate a maximum time-dependent error based on a duration of the holdover period;
  estimate a maximum temperature-dependent error based on a current temperature;
  determine an estimated total maximum error based on the estimated maximum time-dependent error and the estimated maximum temperature-dependent error;
a communication system configured to transmit the local time signal and the estimated total maximum error to at least one receiving device.

15. The system of claim 14, wherein the external time source interface comprises a Global Navigation Satellite System input; and
wherein the external time signal is received via the Global Navigation Satellite System interface.

16. The system of claim 14, wherein the external time source interface comprises an Inter-Range Instrumentation Group (IRIG) input; and
wherein the external time signal is received via the IRIG input.

17. The system of claim 14, wherein the communication system comprises:
a network communication port configured to distribute the local time signal and the estimated total maximum error to the at least one receiving device.

18. The system of claim 14, wherein the local time signal and the estimated total maximum error are distributed to the at least one receiving device using a protocol selected from the group consisting of an Inter-Range Instrumentation Group protocol, an IEEE 1588 protocol, a Network Time Protocol, a Simple Network Time Protocol, and a synchronous transport protocol.

19. The system of claim 14, wherein the local time source comprises one of a voltage-controlled temperature compensated crystal oscillator, a phase locked loop oscillator, a time locked loop oscillator, a rubidium oscillator, a cesium oscillator, a microelectromechanical oscillator, an oven controlled crystal oscillator, and temperature compensated crystal oscillator.

20. The system of claim 14, wherein the holdover subsystem is further configured to determine whether the current temperature falls outside of a bounded range and to apply an adjustment to the maximum temperature-dependent error when the current temperature falls outside of the bounded range.

21. The system of claim 14, wherein the time source subsystem is further configured to correct the local time signal based on the estimated maximum time-dependent error and the estimated maximum temperature-dependent error.

22. The system of claim 14, further comprising:
a time source subsystem configured to compare the local time signal and the external time signal and determine:
  a temperature-dependent signal drift rate of the local time signal relative to the external time signal; a time-dependent signal drift rate of the local time signal relative to the external time signal; and
wherein the holdover subsystem is further configured to estimate the maximum time-dependent error is further based on the temperature-dependent signal drift rate and estimating the maximum temperature-dependent error is further based on the time-dependent signal drift rate.

23. The system of claim 22, further comprising:
a temperature determination subsystem configured to determine a plurality of temperature measurements in proximity to the local time source at a corresponding plurality of times;
wherein the time source subsystem is configured to utilize the plurality of temperature measurements to determine the temperature-dependent signal drift rate.

24. The system of claim 22, further comprising:
a temperature-dependent model subsystem configured to develop a temperature-dependent model based on a plurality of temperature measurements and comparison of the local time signal to the external time signal at a corresponding plurality of times; and
wherein the time source subsystem uses the temperature-dependent model to determine the maximum temperature-dependent error.

25. The system of claim 22, further comprising:
a time-dependent model subsystem configured to develop a time-dependent model based on a plurality of comparisons of the local time signal to the external time signal at a corresponding plurality of times; and
wherein the time source subsystem uses the time-dependent model to determine the maximum time-dependent error.

* * * * *